United States Patent
Narasimalu et al.

(10) Patent No.: US 6,918,528 B2
(45) Date of Patent: Jul. 19, 2005

(54) TRANSDUCER TOOL HOLDER

(75) Inventors: Srikanth Narasimalu, Singapore (SG); Sathish Kumar Balakrishnan, Singapore (SG); Ka Shing Kenny Kwan, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 89 days.

(21) Appl. No.: 10/426,167

(22) Filed: Apr. 29, 2003

(65) Prior Publication Data

US 2004/0217147 A1 Nov. 4, 2004

(51) Int. Cl.$^7$ .............................. B23K 37/00; B23K 1/20
(52) U.S. Cl. ..................... 228/44.3; 228/1.1; 228/4.5; 228/44.7
(58) Field of Search ................ 228/1.1, 4.5, 180.5, 228/110.1, 44.3, 44.7

(56) References Cited

U.S. PATENT DOCUMENTS

| | | | | |
|---|---|---|---|---|
| 5,180,093 A | | 1/1993 | Stansbury et al. ............ 228/1.1 |
| 5,368,216 A | * | 11/1994 | Sakakura et al. ............ 228/1.1 |
| 5,494,207 A | * | 2/1996 | Asanasavest ............. 228/110.1 |
| 5,699,951 A | * | 12/1997 | Miyoshi ..................... 228/4.5 |
| 5,702,049 A | * | 12/1997 | Biggs et al. ................ 228/105 |
| 5,944,249 A | * | 8/1999 | Macabitas et al. ....... 228/180.5 |
| 6,005,663 A | * | 12/1999 | Waterhouse et al. ........ 356/344 |
| 6,422,448 B2 | | 7/2002 | Kyomasu et al. ............ 228/1.1 |

FOREIGN PATENT DOCUMENTS

JP  11-121546  4/1999

* cited by examiner

Primary Examiner—Lynne R. Edmondson
(74) Attorney, Agent, or Firm—Ostrolenk, Faber, Gerb & Soffen, LLP

(57) ABSTRACT

A transducer horn for holding a tool, such as a capillary, for a wire bonder has a pair of resilient arms which flex to clamp about a tool placed in a passage between the arms. The arms have free distal ends between which a wedge is inserted to open the passage to allow the tool to be inserted into, or removed from, the tool holder. The arms may be covered by protective walls, in which case an end wall is provided with an aperture to allow the wedge to access a slot between the arms.

12 Claims, 3 Drawing Sheets

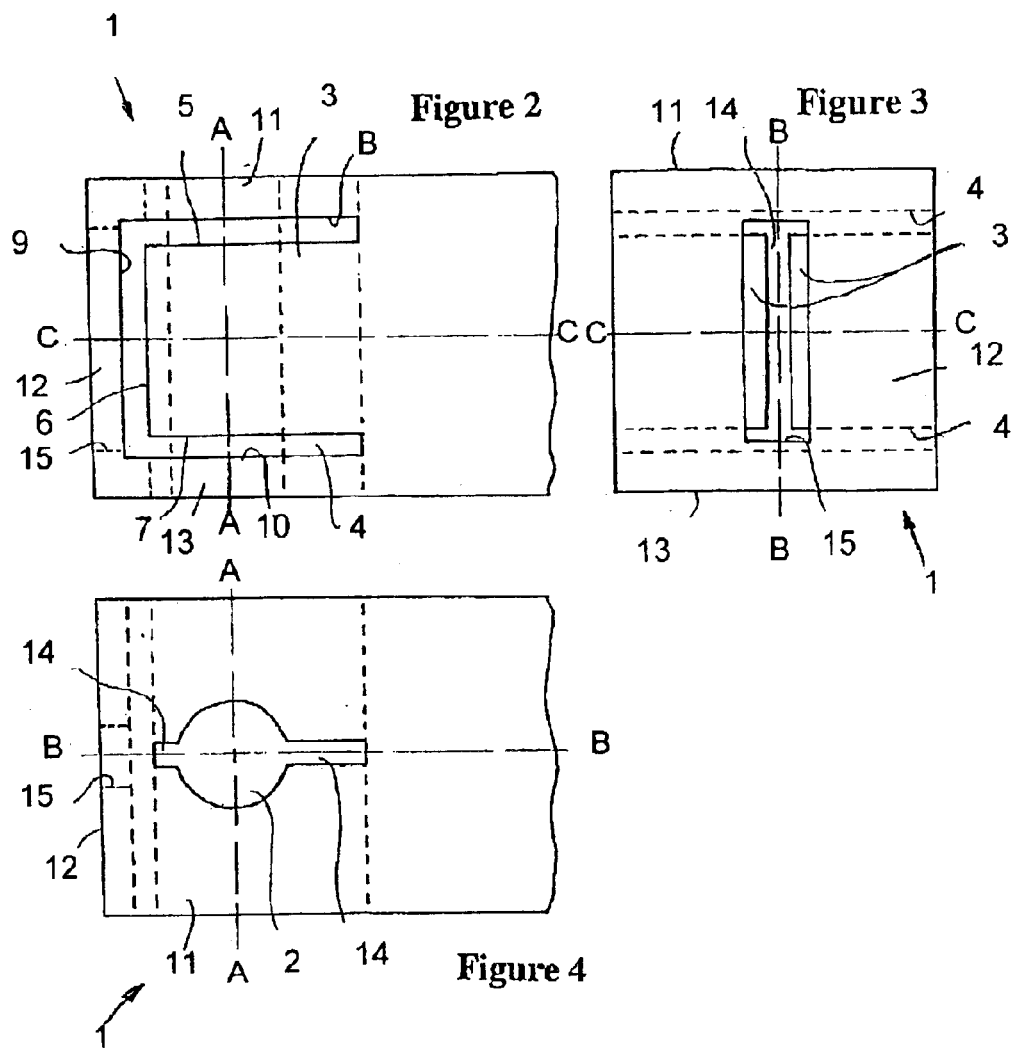

TRANSDUCER TOOL HOLDER

FIELD OF THE INVENTION

The invention relates to transducer horns used in the bonding of wires to bonding pads, and in particular to the support of a capillary in an ultrasonic transducer horn for use in a wire bonder.

BACKGROUND

Japanese Patent Abstract 11121546A2 "Capillary-holding structure of ultrasonic horn" describes a capillary held in a slotted aperture which is clamped around the capillary by a transverse bolt fitted through a washer and screwed into a nut.

The mass of the transducer horn in this prior art arrangement is unbalanced due to the head of the bolt lying on one side of the transducer tip. This imbalance causes the transducer tip to twist dr sway as it is advanced toward the bonding site.

U.S. Pat. No. 5,180,093 "Apparatus for ultrasonic bonding" describes a bonding tool carried in a passage in the tip of an ultrasonic transducer. A threaded set screw at the tip forces the tool against edges and flat surfaces in the passage to secure the tool to the transducer. This arrangement does not provide an efficient transfer of ultrasonic energy due to the small area of contact between the transducer and the tool.

In both the prior art arrangements cited above, the transducer capillary or tool experiences a reduced vibration amplitude at ultrasonic frequencies due to the additional mass of the mounting screw and associated hardware which absorbs kinetic energy for its motion.

Also, the additional mass of the clamping hardware at the tip of the transducer drastically reduces the low frequency resonance of the tip (i.e. below 2000 Hz) by at least 100 Hz, reduces the resonant frequency at the ultrasonic frequency range and increases the impedance of crystals in the ultrasonic transducer.

Furthermore, arrangements requiring adjustment of a threaded screw to tighten the tool or capillary mounting suffer from variation in clamping force at the tool-horn interface due to human error or normal variation in the tightening torque applied by production technicians.

Still further, systems using a threaded fastener suffer, over time, from wear of the thread and the threaded hole into which it is fitted, causing further deterioration in transfer of energy and difficulties in applying the correct torque to provide consistent tightening of the tool to the horn.

U.S. Pat. No. 6,422,448 "Ultrasonic horn for a bonding apparatus" describes a capillary mounted in a hole in an ultrasonic horn. The capillary hole communicates with a parallel second hole by way of a slot. A non-circular jig temporarily inserted into the second hole is rotated to widen the capillary hole allowing insertion or removal of a capillary tool. Upon a second rotation of the jig, the capillary hole returns toward its original size to grip the capillary. This provides a more repeatable attachment of the capillary to the transducer, than systems requiring adjustment of a threaded bolt or screw. However, the insertion of the jig from above, and the rotation of the jig to manipulate the size of the capillary hole, can apply undesirable forces to the Z-axis assembly of the bonding apparatus.

SUMMARY OF THE INVENTION

It is an object of one embodiment of the invention to provide a capillary-horn mounting system which reduces at least some of the problems identified above with the prior art.

In broad terms in one aspect the invention may be said to consist in a tool holder having at an end portion thereof a transverse passage for clamping engagement of part of a tool, the passage being intersected by a first slot, wherein the first slot divides the end portion of the tool holder into two separate arms having free distal ends.

Preferably, the tool holder includes an end wall which is spaced from, and extends over, the distal ends of the arms and has a second slot which is substantially aligned with the first slot.

Preferably, the width of the second slot is greater than the width of the first slot.

Preferably the tool holder is part of a bonding transducer.

Preferably, the tool holder is an ultrasonic transducer horn for a bonding apparatus.

Preferably, the tool is a capillary.

Preferably, the first slot extends from the free distal ends of the arms, through the passage, and into the tool holder beyond the passage.

Preferably, the passage is cylindrical.

Preferably, the end wall is joined to, and spans between, respective distal ends of a pair of substantially parallel side walls; the end wall and side walls extend over, and are spaced from, the arms; and the side walls are provided with respective apertures which form continuations of the cylindrical passage.

Preferably, the passage is circularly cylindrical.

Preferably, the first slot has substantially parallel and planar side walls.

Preferably, the first slot has substantially parallel and planar side walls and the axis of the cylindrical passage is substantially perpendicular to the walls of the slot.

Alternatively, the first slot has substantially parallel and planar side walls and the axis of the cylindrical passage is substantially parallel to the walls of the slot.

The invention may further be said to consist in any alternative combination of parts or features mentioned herein or shown in the accompanying drawings. Known equivalents of these parts or features which are not expressly set out are nevertheless deemed to be included.

BRIEF DESCRIPTION OF DRAWINGS

A preferred embodiment of the invention will now be described, by way of example only and without intending to be limiting, with reference to the drawings of which:

FIG. 2 shows a side view of the end portion shown in FIG. 1, FIG. 3 shows an end view of the end portion shown in FIGS. 1 and 2, FIG. 4 shows a top plan view of the end portion shown in FIGS. 1 to 3.

DETAILED DESCRIPTION OF A PREFERRED EMBODIMENT

Figure 1:
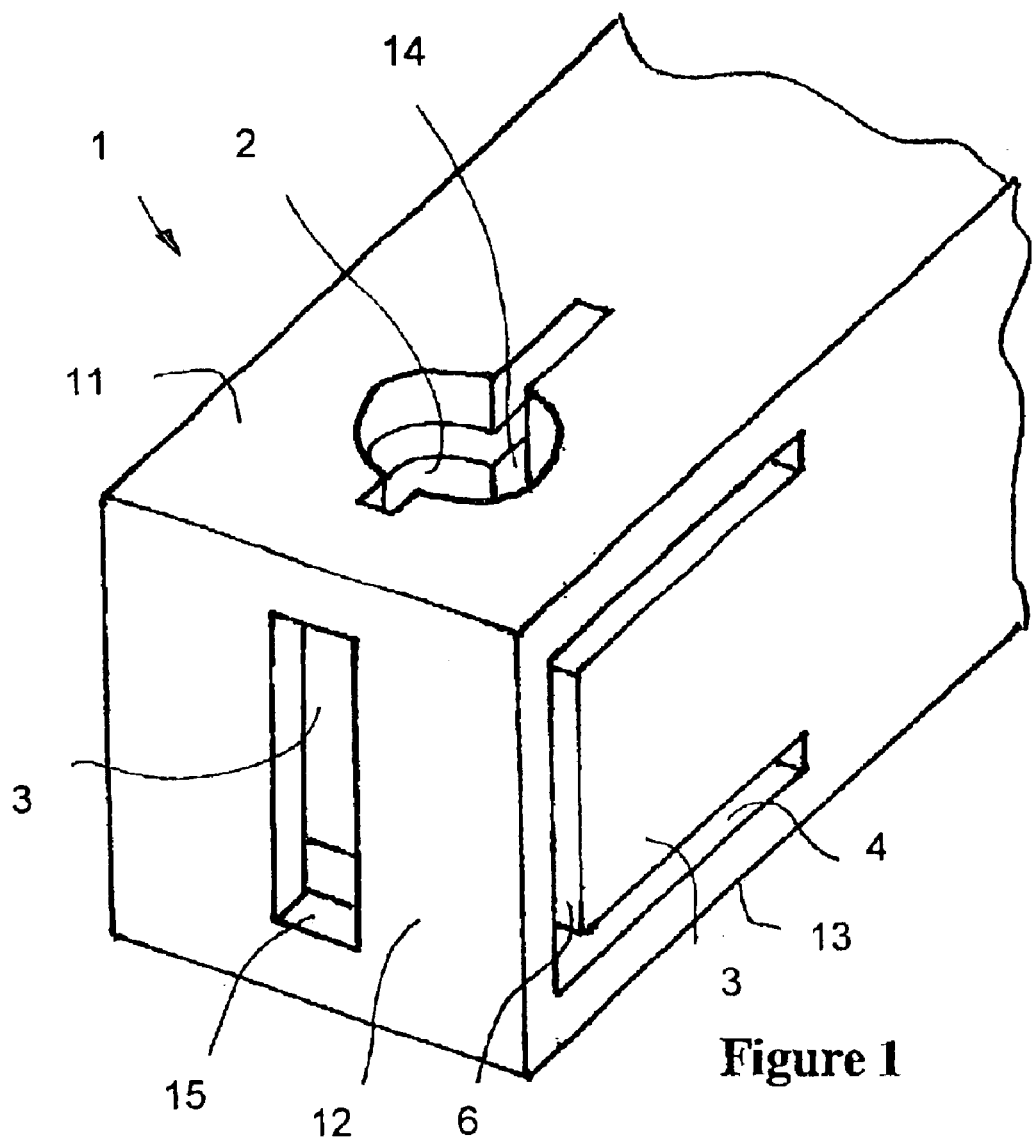
FIG. 1 shows an isometric view of an end potion of a first embodiment of tool holder according to the current invention.
Figures 5, 6, 7:
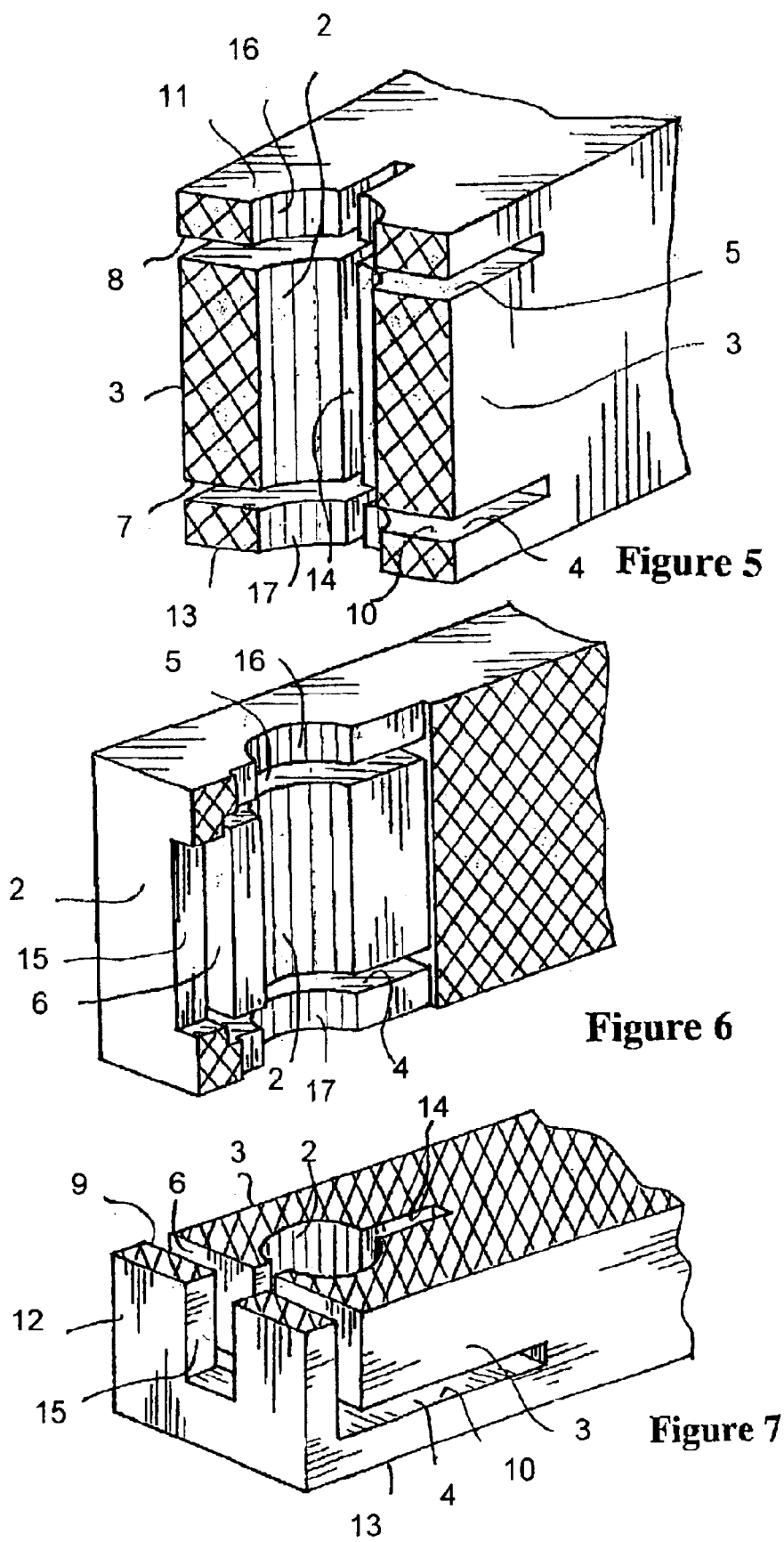
FIG. 5 shows an isometric view of a sectioned portion of the end pail shown in FIGS. 1 to 4, the section taken at the vertical plane A—A as indicated in FIGS. 2 and 4.
FIG. 6 shows an isometric view of a sectioned portion of the end part shown in FIGS. 1 to 4, the section taken at the vertical plane B—B as indicated in FIGS. 3 and 4.
FIG. 7 shows an isometric view of a sectioned portion of the end part shown in FIGS. 1 to 4, the section taken at the horizontal plane C—C as indicated in FIGS. 2 and 3.

Referring to the drawings it will be appreciated that a tool holder for an ultrasonic transducer may be implemented in various forms. The following embodiment is described by way of example only.

It is to be understood that references to up, down, above, below, upper, under, underside, front, rear, left, right, inner, outer, end, side, horizontal, vertical, and other similar references, e.g. to directions or to the relative positions of components or features described, are given only for the convenience of description and are to be understood, unless where inappropriate, in the context of the orientation of the portion of the horn as shown by the isometric view of FIG. 1, and are not to be construed as limiting the invention to any particular orientation The figures show an end portion 1 of an ultrasonic transducer horn which is adapted for holding a tool (not shown). In a preferred application the tool is a capillary used for wire bonding and is made by sintering a powder to provide a ceramic capillary with tightly toleranced dimensions.

The end portion of the transducer horn is machined from bulk material by the combined use of wire-cutting and an Electro-Discharge Method (EDM) to form a passage 2 between two resilient arms 3 which act as jaws to clamp the tool in the transducer horn. The passage is shaped to correspond to the shape of the shaft of the tool which is preferably cylindrical and more preferably a circular cylinder.

The axis of the passage is transverse to the generally longitudinal axis of the horn. In the embodiment shown in the figures, the passage is substantially vertically transverse, but in an alternative embodiment may be substantially horizontally transverse as will be further explained below.

In the embodiment shown, the passage 2 is a circular cylinder which has a natural diameter, i.e. when the arms are not flexed, of slightly less than that of the shaft of a circularly cylindrical tool to be carried in the horn. The tool, when inserted into the passage, is held securely in the horn by the clamping of the arms about the shaft of the tool. The clamping is achieved by flexure of the arms which close about the tool. The resilience inherent in the arms of the horn or tool holder urges the arms to close the passage about the tool, and to thereby clamp the tool in the horn or tool holder in the absence of any fastener such as a threaded screw or bolt.

As may be best appreciated from the side view of FIG. 2, a rectangular C-shaped transverse slot 4 is machined in the tip of the horn. The upper, end and lower inner surfaces 5, 6, 7 of this C-shaped slot define the upper, outer and lower perimeter of the arms. The upper, end and lower outer surfaces 8, 9, 10 of the C-shaped slot define the inner surfaces of upper, end and lower walls 11, 12, 13 which cover the two arms 3. The end wall 12 is joined to, and spans between, the respective distal ends of the upper and lower walls 11, 13 which are substantially mutually parallel. These walls provide a cover over the tool-holding arms of the horn to protect the arms from damage.

The arms 3 are separated from one another by a further slot 14, as may be best appreciated from the top plan view of FIG. 4. The slot 14 is substantially vertical and divides part of the tip of the horn into the two arms. The slot 14 separating the arms extends inwardly beyond the passage 2 but does not extend outwardly beyond the outer end surface of the C-shaped slot. The axis of the passage 2 is thus substantially parallel to the vertical slot 14.

Preferably, the three parts of the of the C-shaped slot 4 and the vertical slot 14 each have substantially parallel and planar side walls as shown in the figures.

An aperture 15 is cut into the end wall 12, as may be best appreciated from the end view of FIG. 3, to provide access to the outer end of the vertical slot 14 between the arms.

The tool-holding passage is continued by respective passages 16, 17 in the upper and lower walls 11, 13. The continuation passages 16, 17 are appropriately sized to allow axial insertion of the shaft of the tool.

The arms 3 can be flexed apart to open the tool-holding passage 2 by inserting the thin end of a wedge (not shown) into the aperture 15 and into the slot 14 between the arms. With the passage 2 wedged open, a tool may then be readily inserted into, or removed from, the passage. Upon removal of the wedge, the flexed arms close about the shaft under their inherent resilience and tightly engage the shaft of the tool.

The degree of clamping of the tool by the horn is defined by the resilient flexure of the arms machined from the bulk material of the horn and not by any adjustment, such as the tightening of a clamping screw by a human operator. This absence of a screw fastener to clamp the tool avoids the unbalance and energy-absorbing problems of the prior art noted above, while at the same time providing a repeatable clamping action. Furthermore, the tool can be replaced in a shorter time than in the case of a screwed clamp, while still achieving a repeatable degree of clamping. This is of advantage in a production environment.

The current invention also provides an improved dynamic rigidity as well as good ultrasonic energy transfer at the horn-tool interface due to the repeatable clamping and to the larger contact area between capillary and horn.

By providing the arms 3 with free distal ends as described above, the arms may be flexed to open the tool-holding passage 2 by insertion of a wedge in the longitudinal direction of the horn. The force applied to the horn in this operation is largely in the longitudinal direction. This is in distinction to the largely transverse or torsional bending forces which are applied to the horn when opening the tool-holding passage of the prior art cited above. The current invention therefore allows a reduction of undesirable forces on the horn-supporting assembly, and in particular undesirable deformation forces on the z-axis assembly of a wire bonder in one preferred application.

In one alternative arrangement (not shown), the covering walls 11, 12, 13, which cover the arms in the arrangement described above, are dispensed with and the arms left exposed. By omitting the walls, the tip of the horn can be made more compact while maintaining the dimensions of the arms as in the arrangement described above. Alternatively, by omitting the walls, the arms can be made larger while keeping the external dimensions of the horn within the dimensions of the arrangement described above.

In yet a further arrangement not shown, the passage which accommodates the shaft of the tool is substantially horizontally transverse to the generally longitudinal axis of the horn; i.e. the passage is substantially perpendicular to the slot separating the arms. In this case, insertion of the wedge into the slot between the arms, rather than expanding the passage to allow insertion or removal of the tool (as in the embodiment shown in the figures), causes the passage to bend. The horn is fabricated by first forming the arms by cutting the slot between the arms. Secondly, a wedge is inserted between the arms to flex the arms apart. And thirdly, the passage is formed in the outwardly flexed arms.

The passage is thus formed with a first length portion in one arm and a second length portion in the other arm. After an appropriately-dimensioned tool shaft is inserted into the passage, the wedge is removed. The resilience of the arms urges them to return to their natural position, mis-aligning the respective axes of the two length portions of the passage which thus clamps against the tool shaft.

The foregoing describes the invention including preferred forms thereof. Alterations and modifications as will be obvious to those skilled in the art are intended to be incorporated within the scope hereof as defined in the accompanying claims.

What is claimed is:

1. A tool holder comprising:
   the tool holder having an end portion and having a longitudinal axis;
   a passage that is transverse to the tool holder longitudinal axis, wherein the passage is sized and shaped for engaging and clamping at least part of a tool;
   a first slot that intersects the passage and that forms two separate arms that define a division in the end portion, and each of the two separate arms has a free distal end;
   an end wall which is spaced from and extends over the free distal ends of the two separate arms; and a second slot in the end-wall, wherein the second slot is substantially aligned with the first slot.

2. The tool holder as claimed in claim 1, wherein the width of the second slot is greater than the width of the first slot.

3. The tool holder as claimed in claim 1, wherein the tool holder is part of a bonding transducer.

4. The tool holder as claimed in claim 3, wherein the tool holder is an ultrasonic transducer horn for a bonding apparatus.

5. The tool holder as claimed in claim 1, wherein the tool is a capillary.

6. The tool holder as claimed claim 1, wherein the first slot extends from the free distal ends of the arms, through the passage, and into the tool holder beyond the passage.

7. The tool holder as claimed in claim 1, wherein the passage is cylindrical.

8. The tool holder as claimed in claim 7, wherein the end wall is joined to and spans between respective distal ends of a pair of substantially parallel side walls; the end wall and substantially parallel side walls extend over and are spaced from the arms, and the substantially parallel side walls are provided with respective apertures which form continuations of the cylindrical passage.

9. The tool holder as claimed in claim 7, wherein the passage is circularly cylindrical.

10. The tool holder as claimed in claim 1, wherein the first slot has substantially parallel and planar side walls.

11. The tool holder as claimed in claim 7, wherein the first slot has substantially parallel and planar side walls and the axis of the cylindrical passage is substantially perpendicular to the walls of the slot.

12. The tool holder as claimed in claim 7, wherein the first slot has substantially parallel and planar side walls and the axis of the cylindrical passage is substantially parallel to the walls of the slot.

* * * * *